United States Patent
Li et al.

(10) Patent No.: US 11,859,082 B2
(45) Date of Patent: Jan. 2, 2024

(54) POLYMERS USEFUL AS SURFACE LEVELING AGENTS

(71) Applicant: Rohm and Haas Electronic Materials LLC, Marlborough, MA (US)

(72) Inventors: Mingqi Li, Shrewsbury, MA (US); Irvinder Kaur, Northborough, MA (US)

(73) Assignee: ROHM AND HAAS ELECTRONIC MATERIALS LLC, Marlborough, MA (US)

(*) Notice: Subject to any disclaimer, the term of this patent is extended or adjusted under 35 U.S.C. 154(b) by 132 days.

(21) Appl. No.: 17/139,269

(22) Filed: Dec. 31, 2020

(65) Prior Publication Data

US 2022/0204760 A1 Jun. 30, 2022

(51) Int. Cl.
| | | |
|---|---|---|
| *C08L 71/02* | (2006.01) | |
| *C08L 71/08* | (2006.01) | |
| *C08L 33/08* | (2006.01) | |
| *G03F 7/16* | (2006.01) | |
| *C08K 5/00* | (2006.01) | |
| *C09D 5/00* | (2006.01) | |
| *C08L 33/10* | (2006.01) | |

(52) U.S. Cl.
CPC ............ *C08L 71/02* (2013.01); *C08K 5/0025* (2013.01); *C08L 33/08* (2013.01); *C08L 33/10* (2013.01); *C08L 71/08* (2013.01); *C09D 5/006* (2013.01); *G03F 7/16* (2013.01)

(58) Field of Classification Search
CPC .......... C08L 71/02; C08L 33/08; C08L 33/10; C08L 71/08; C08K 5/0025; C09D 5/006; G03F 7/16
USPC ....................................................... 528/425
See application file for complete search history.

(56) References Cited

U.S. PATENT DOCUMENTS

| | | | | |
|---|---|---|---|---|
| 2,917,468 | A | 12/1959 | Schnell et al. | |
| 3,859,253 | A | 1/1975 | Bourat et al. | |
| 4,806,613 | A * | 2/1989 | Wardle ................ | C08G 18/755 528/65 |
| 6,383,651 | B1 | 5/2002 | Weinert et al. | |
| 6,660,828 | B2 | 12/2003 | Thomas et al. | |
| 7,659,413 | B2 | 2/2010 | Kamata et al. | |
| 2013/0183262 | A1 | 7/2013 | Wynne et al. | |

FOREIGN PATENT DOCUMENTS

| | | | | |
|---|---|---|---|---|
| JP | 2004149771 A | * | 5/2004 | ............ C08G 18/48 |
| JP | 2005068292 A | | 3/2005 | |
| JP | 2015145437 A | * | 8/2015 | ............ C08G 18/67 |
| WO | 2005028550 A2 | | 3/2005 | |

OTHER PUBLICATIONS

Motofuji et al., JP 2015-145437 A machine translation in English, Aug. 13, 2015 (Year: 2015).*
Kobayashi et al., JP 2004-149771 A machine translation in English, May 27, 2004 (Year: 2004).*
Fujiwara et al.; "Synthesis and Characterization of Novel Amphiphilic Telechelic Polyoxetanes"; Macromolecules; 36, Jun. 2003, pp. 9383-9389.
Makal et al.; "Polyurethanes Containing Oxetane-Derived Poly(2,2-substituted-1,3-propylene oxide) Soft Blocks: Copolymer Effect on Wetting Behavior"; Langmuir; 21; Aug. 2005, pp. 10749-10755.
Parzuchowski et al.; "Poly-(3-ethyl-3-hydroxymethyl)oxetanes—Synthesis and Adhesive Interactions with Polar Substrates"; Polymers ; 12, 222; Jan. 2020, 13 pages.
Schulte et al.;"Form.of Linear&Cyclic Polyoxetanes in the Cationic Ring-Opening Polym.of3-Allyloxymethyl-3-ethyloxetane&Subs. Postpolym.Mod.of Poly(3-allyloxymethyl-3-ethyloxetane)";J. of Polymer Science,Part A: Polymer Chemistry;51;Mar. 2013,p. 1243-1254.
Takeuchi et al.;"Lewis Acid-Promoted Anionic Polym.of a Monomer w/High Cationic Polym . . . Syn.of Narrow Molec. Weight Distrib.Polyoxetane&Polyoxetane-Poly(methyl methacrylate)Block Cop.w/Aluminum Porphyrin Initiators"; Macromolecules;28;Jan. 1995,pp. 651-652.

(Continued)

*Primary Examiner* — David T Karst
(74) *Attorney, Agent, or Firm* — CANTOR COLBURN LLP

(57) ABSTRACT

Disclosed herein is a copolymer comprising first polymerized units of the formula (1):

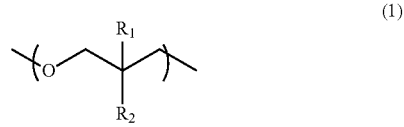

wherein: $R_1$ is H or a substituted or unsubstituted $C_1$-$C_6$ alkyl group; and $R_2$ is a substituted or unsubstituted $C_3$-$C_{20}$ alkyl group that optionally includes one or more of —O—, —S—, —N—, —C(O)—, or —C(O)O—, —N—C(O)—, —C(O)—NR—; wherein R is H or a substituted or unsubstituted $C_1$-$C_6$ alkyl group; and second polymerized units of the formula (2):

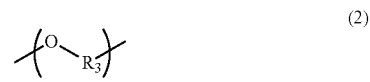

wherein: $R_3$ is a substituted or unsubstituted $C_1$-$C_6$ alkyl group that optionally includes one or more of —O—, —N—, —S—, —C(O)—, or —C(O)O—; wherein the first polymerized units and the second polymerized units are chemically different, and the copolymer is free of fluorine.

9 Claims, No Drawings

(56) References Cited

OTHER PUBLICATIONS

Wynne et al.; "Model Fluorous Polyurethane Surface Modifiers Having Co-polyoxetane Soft Blocks with Trifluoroethoxymethyl and Bromomethyl Side Chains"; Langmuir; 23; Jun. 2007, pp. 10573-10580.

Zolotarskaya et al; "Synthesis and Characterization of Clickable Cytocompatible Poly(ethylene glycol)-Grafted Polyoxetane Brush Polymers"; Macromolecules; 46; Jan. 2013, pp. 63-71.

* cited by examiner

POLYMERS USEFUL AS SURFACE LEVELING AGENTS

BACKGROUND

Disclosed herein are polymers useful as surface leveling agents, methods of manufacture thereof and articles comprising the same.

Surface leveling agents (SLAs) are used in compositions for manufacturing thin films and coating solutions. Surface leveling agents typically tend to migrate to a free surface (a surface that contacts air) and facilitate a leveling of the surface or a smoothing of the surface. Surface leveling agents generally comprise polymers or oligomers that have a lower surface energy when compared with other molecules in the solution and the low surface energy causes them to selectively segregate to the free surface even at a low-solids loading. This ability to migrate to a surface (i.e., molecular mobility) facilitates the flow and leveling of the surface/interfacial layer to produce flat smooth surface/interfaces.

The most common surface leveling agent includes polysiloxanes, alkyl modified acrylic polymers, polyesters or fluorocarbons. A good surface leveling agent possesses properties such as, for example, excellent slip, leveling, flow, surface tension reduction, anti-crater capabilities, anti-fisheye capabilities, substrate wetting, anti-bernard cell forming tendency, as well as good foam stability.

Surface leveling agents play a vital role in a variety of coating formulations, for example, spin-on thin films that enable microlithography. With ever-increasing patterning feature resolution, aspect ratios and the need for low defectivity lithographic patterns, pursuing new materials strategies for surface leveling agents is desirable.

There are a number of reasons why defects are produced by surface leveling agents. Some of these are listed below. Most surface leveling agents contain silicon or fluorine moieties and are highly hydrophobic. The hydrophobic nature of these surface leveling agents unfortunately is a major source of defects in advanced photoresist patterning. These defects include not only surface defects, but other types such as the precipitation of residue, bridging defects, pattern non-opening defects, and the like.

Many lithographic patterning processes deploy aqueous base developers. Insoluble species in these base developers produce undissolved residue, which produces defects. It is therefore desirable for any exposed resist material to be fully removable and not leave behind undissolved residue that may potentially form defects.

In order to overcome this problem, the surface leveling agent is used in a photoresist composition in the least amount possible. Another manner of employing the surface leveling agent is to modify the agent to contain base soluble units or to contain base-switchable functional groups to enable solubility. In other words, it is desirable for surface leveling agents that include fluorine and/or silicon moieties to be specially modified to in order to be used in a photoresist composition.

Another concern for surface leveling agents that contain fluorine are regulatory concerns. Governmental regulations seek minimal utilization products that contain fluorine.

It is therefore desirable to develop surface leveling agents that can be used in compositions for lithography or coating applications and that does not contain fluorocarbons and provides good surface leveling properties that do not produce defects in the resulting article.

SUMMARY

Disclosed herein is a copolymer comprising first polymerized units of the formula (1):

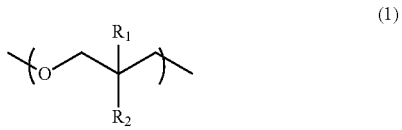

(1)

wherein: $R_1$ is H or a substituted or unsubstituted $C_1$-$C_6$ alkyl group; and $R_2$ is a substituted or unsubstituted $C_3$-$C_{20}$ alkyl group that optionally includes one or more of —O—, —S—, —N—, —C(O)—, or —C(O)O—, —N—C(O)—, —C(O)—NR—; wherein R is H or a substituted or unsubstituted $C_1$-$C_6$ alkyl group; and second polymerized units of the formula (2):

(2)

wherein: $R_3$ is a substituted or unsubstituted $C_1$-$C_6$ alkyl group that optionally includes one or more of —O—, —N—, —S—, —C(O)—, or —C(O)O—; wherein the first polymerized units and the second polymerized units are chemically different, and the copolymer is free of fluorine.

DETAILED DESCRIPTION

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise.

As used herein, an "acid-labile group" refers to a group in which a bond is cleaved by the catalytic action of an acid, optionally and typically with thermal treatment, resulting in a polar group, such as a carboxylic acid or alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-labile groups," and "acid-sensitive groups."

"Substituted" means that at least one hydrogen atom on the group is replaced with another atom or group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—$NO_2$), cyano (—CN), hydroxy (—OH), oxo (=O), amino (—$NH_2$), mono- or di-($C_{1-6}$) alkylamino, alkanoyl (such as a $C_{2-6}$ alkanoyl group such as acyl), formyl (—C(=O)H), carboxylic acid or an alkali metal or ammonium salt thereof; esters (including acrylates, methacrylates, and lactones) such as $C_{2-6}$ alkyl esters (—C(=O)O-alkyl or —OC(=O)-alkyl) and $C_{7-13}$ aryl esters (—C(=O)O-aryl or —OC(=O)-aryl); amido (—C(=O)

$NR_2$ wherein R is hydrogen or $C_{1-6}$ alkyl), carboxamido (—CH2C(=O)$NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl ($CH_3C_6H_4SO_2$—). When a group is substituted, the indicated number of carbon atoms is the total number of carbon atoms in the group, excluding those of any substituents. For example, the group —$CH_2CH_2CN$ is a $C_2$ alkyl group substituted with a cyano group.

In the present specification, "(meth)acrylate" represents "at least one of acrylate and methacrylate." In addition, "(meth)acrylic acid" means "at least one of acrylic acid and methacrylic acid".

The term "alkyl", as used herein, means a branched or straight chain saturated aliphatic hydrocarbon group having the specified number of carbon atoms, generally from 1 to about 12 carbon atoms. The term $C_{1-C6}$ alkyl as used herein indicates an alkyl group having from 1, 2, 3, 4, 5, or 6 carbon atoms. Other embodiments include alkyl groups having from 1 to 8 carbon atoms, 1 to 4 carbon atoms or 1 or 2 carbon atoms, e.g. $C_1$-$C_6$ alkyl, $C_1$-$C_4$ alkyl, and $C_1$-$C_2$ alkyl. When $C_0$-$C_4$ alkyl is used herein in conjunction with another group, for example, (cycloalkyl)$C_0$-$C_4$ alkyl, the indicated group, in this case cycloalkyl, is either directly bound by a single covalent bond ($C_0$), or attached by an alkyl chain having the specified number of carbon atoms, in this case 1, 2, 3, or 4 carbon atoms. Examples of alkyl include, but are not limited to, methyl, ethyl, n-propyl, isopropyl, n-butyl, 3-methylbutyl, t-butyl, n-pentyl, and sec-pentyl.

The term "cycloalkyl", as used herein, indicates a saturated hydrocarbon ring group, having only carbon ring atoms and having the specified number of carbon atoms, usually from 3 to about 8 ring carbon atoms, or from 3 to about 7 carbon atoms. Examples of cycloalkyl groups include cyclopropyl, cyclobutyl, cyclopentyl, or cyclohexyl as well as bridged or caged saturated ring groups such as norborane or adamantane.

The term "heterocycloalkyl", as used herein, indicates a saturated cyclic group containing from 1 to about 3 heteroatoms chosen from N, O, and S, with remaining ring atoms being carbon. Heterocycloalkyl groups have from 3 to about 8 ring atoms, and more typically have from 5 to 7 ring atoms. Examples of heterocycloalkyl groups include morpholinyl, piperazinyl, piperidinyl, and pyrrolidinyl groups. A nitrogen in a heterocycloalkyl group may optionally be quaternized.

In citations for a group and an atomic group in the present specification, in a case where the group is denoted without specifying whether it is substituted or unsubstituted, the group includes both a group and an atomic group not having a substituent, and a group and an atomic group having a substituent. For example, an "alkyl group" which is not denoted about whether it is substituted or unsubstituted includes not only an alkyl group not having a substituent (unsubstituted alkyl group), but also an alkyl group having a substituent (substituted alkyl group).

Disclosed herein is a surface leveling agent that is used in surface-active chemical applications, in particular lithographical compositions for manufacturing spin-on thin films. The surface leveling agent comprises a copolymer of two or more polymeric units that have ether linkages in the chain backbone. The two or more polymeric units are free of fluorine. In an optional embodiment, the polymers are free of surface energy reducing moieties that comprise silicon. While the aforementioned ether linkages are a part of the polymer backbone, there may be additional functional linkages present in pendent groups (side chains) that are covalently bonded to the copolymer backbone. In an embodiment, these side chains may comprise only carbon-carbon linkages. In another embodiment, these side chains may comprise carbon-carbon linkages in addition to other functional linkages or functional groups, including but not limited to, ether, ester, amide, sulfonate, hydroxy, thiol, cyano, amine, thiol, aldehyde, carboxyl, alkyl halide, ketone, allyl, allenyl, norbornyl, ethynyl, acrylates, methacrylates, itaconates, maleimides, maleic anhydrides, and the like. In other words, the side chain may contain heteroatoms such as nitrogen, sulfur, oxygen, and the like.

The surface leveling agent may be used not only in compositions for lithographic applications, but may also in other applications such as, for examples, coatings, paints, inks, plating solutions, medical, anticorrosion, and lubrication technologies, where good surface leveling and glossy appearance are desirable.

In an exemplary embodiment, at least one of the polymeric unit of the copolymer is a polyoxetane having at least one alkyl substituent along the chain backbone (hereinafter polyalkyloxetane). The polyoxetane backbone provides the surface leveling agent copolymer with hydrophilicity that facilitates miscibility with bases and with water, while the alkyl side chain provides hydrophobicity for the migration of the surface leveling agent to an interface in a thin film or a coating. The interface may lie between the spin-on layer and air, or alternatively, between two layers in a multilayer film. In an embodiment, the polyalkyloxetane is present in the copolymer in an amount of greater than 40 mole percent (mol %).

In an embodiment, the polyoxetane copolymer may contain one or more end functional groups. The end functional group may comprise a hydroxyl, a thiol, a cyano, an amine or a sulfonate.

The aforementioned alkyl substituent may be a straight chain, a branched chain or may optionally contain other atoms such as O, S, N, P, or other functional linkages, which include an ether, an ester, an amide, an imide, a urethane or a urea. The alkyl substituent may also optionally contain an end functional group such as for example, a hydroxyl, a thiol, a cyano, an amine or a sulfonate.

The surface leveling agent may be hydrophobic for certain applications, while it may be hydrophilic enough so as to be miscible with water or an aqueous developer in other applications. The lack of fluorine or silicon containing moieties in the surface leveling agent minimizes defect formation. The lack of fluorine containing moieties complies with environmental regulations.

The surface leveling agent is preferably a copolymer comprising two or more different repeat units. In an embodiment, the surface leveling agent may be a copolymer that comprises three of more different repeat units. The copolymer may be a random copolymer, alternating copolymer, a block copolymer, a star block copolymer, a hyperbranched polymer, a comb copolymer, a dendrimer, a gradient copolymer, or the like, with a random copolymer or a block copolymer being preferred. Combinations of random copolymers and block copolymers may also be used in a surface leveling agent.

In an embodiment, the copolymer comprises first polymerized units of the formula (1):

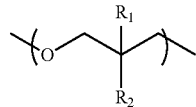
(1)

wherein $R_1$ is H or a substituted or unsubstituted $C_1$-$C_6$ alkyl group; and $R_2$ is a substituted or unsubstituted $C_3$-$C_{20}$ alkyl group that optionally includes one or more of —O—, —S—, —N—, —C(O)—, or —C(O)O—, —N—C(O)—, —C(O)—NR—; wherein R is H or a substituted or unsubstituted $C_1$-$C_6$ alkyl group; and a second polymerized unit of the formula (2):

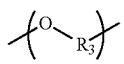
(2)

wherein $R_3$ is a substituted or unsubstituted $C_1$-$C_6$ alkyl group that optionally includes one or more of —O—, —N—, —S—, —C(O)—, or —C(O)O—; wherein the first polymerized units and the second polymerized units are chemically different, and the copolymer is free of fluorine. In a preferred embodiment, $R_3$ is an unsubstituted $C_1$-$C_5$ alkyl.

When $R_3$ is substituted, the substituent chain length has two or less carbon atoms. A hydrophilic polymeric unit of formula (2) can provide benefits of miscibility of the surfactant leveling agent with water or aqueous base developer.

In an embodiment, $R_2$ has a branched structure. In an embodiment, $R_2$ has two or more branches.

In an embodiment, the surface leveling agent comprises a polymerized unit of formula (1), a polymerized unit of formula (2) and comprises an additional polymerized unit of formula (3)

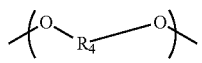
(3)

wherein $R_4$ is a substituted or unsubstituted $C_2$ to $C_4$ alkyl group that optionally includes one or more of —O—, —S—, —N—, —C(O)—, or —C(O)O—, —N—C(O)—, —C(O)—NR—; wherein R is H or a substituted or unsubstituted $C_1$-$C_6$ alkyl group.

As a specific example of the above-mentioned embodiment, the first polymerized units are of the formula (1-1), the second polymerized units are of the formula (2-1), and the third polymerized units are of the formula (4):

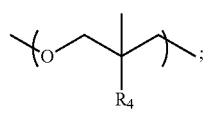
(1-1)

wherein $R_4$ is a substituted or unsubstituted $C_3$-$C_{20}$ alkyl group that optionally includes one or more of —O—, —S—, —N—, —C(O)—, or —C(O)O—;

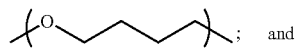
(2-1)

and

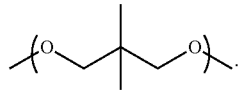
(4)

Examples of the precursor to the polymerized units of formula (1) include 3-methyloxelane, 3-ethyloxetane, 3-propyloxetane, 3-butyloxetane, 3-neupentyloxetane, 3-pentyloxetane, 3-hexyloxetane, 3-(2,2-dimethylbutyl)oxetane, 3-methxymethyloxetane, 3-ethoxymethyloxetane, 3-propoxymethyloxetane, 3-butoxymethyloxetane, 3-neupentoxymethyloxetane, 3-pentoxymethyoxetane, 3-hexoxymethyloxetane, 3-(2,2-dimethylbutoxy)oxetane, 3-methxyethyloxetane, 3-ethoxyethyloxetane, 3-propoxyethyloxetane, 3-butoxyethyloxetane, 3-neupentoxyethyloxetane, 3-pentoxyethyloxetane, 3-hexoxyethyloxetane, 3-butyloxymethyl-3-methyloxetane, 3-butyloxymethyl-3-ethyloxetane, 3-butyloxymethyl-3-propyloxetane, 3-butyloxymethyl-3-butyloxetane, 3-butyloxymethyl-3-pentyloxetane, 3-butyloxymethyl-3-neupentyloxetane, 3-butyloxymethyl-3-hexyloxetane, 3,3-dimethyloxetane, 3-ethyl-3-[(2-ethylhexyloxy)methyl]oxetane, 3-ethyl-3-hydroxymethyl oxetane, 3-ethyl-3-hydroxymethyl oxetane, 3-methyl-3-oxetanemethanol, 3-(1-methylethyl)-oxetane, or a combination thereof.

Examples of the precursor to the polymerized units of formula (2) include formaldehyde, ethylene oxide, propylene oxide, tetrahydrofuran, 1,4-dioxane, or a combination thereof.

Examples of the precursors to the polymerized unit of formula (3) includes 1,3-propane diol, 2,2-dimethyl-1,3-propane diol, 1,4-butane diol, 1,5-pentane diol, 1,6-hexane diol, or a combination thereof.

A preferred precursor to the polymerized units of formula (1) is 3-butyloxymethyl-3-methyloxetane, while a preferred precursor to the polymerized units of formula (2) is tetrahydrofuran. A preferred precursor to the polymerized units of formula (3) is 2,2-dimethyl-1,3-propane diol.

The surface leveling agent may have a weight average molecular weight of 500 to 30,000 grams per mole (g/mole), preferably 800 to 12,000 g/mole and more preferably 1000 to 10,000 g/mole.

The polymerized units of formula (1) are typically present in the copolymer in an amount of greater than 40 mol %, preferably greater than 50 mol % and more preferably greater than 60 mol %, based on the total number of moles in the copolymer. The polymerized units of formula (1) are present in the copolymer in an amount of less than 80 mol %, preferably less than 75 mol % and more preferably greater than 70 mol %, based on the total number of moles in the copolymer.

In an embodiment, the polymerized units of formula (2) are present in the copolymer in an amount of greater than 20 mol %, preferably greater than 25 mol % and more preferably greater than 70 mol %, based on the total number of moles in the copolymer. In an embodiment, the polymerized units of formula (2) are present in the copolymer in an amount of less than 60 mol %, preferably less than 50 mol % and more preferably less than 40 mol %, based on the total number of moles in the copolymer.

In an embodiment, the polymerized units of formula (3) are present in the copolymer in an amount of greater than or equal to 0.01 mol %, preferably greater than or equal to 1 mol % and more preferably greater than or equal to 2 mol %, based on the total number of moles in the copolymer. In an embodiment, the polymerized units of formula (3) are present in the copolymer in an amount of less than or equal to 20 mol %, preferably less than or equal to 15 mol % and more preferably less than or equal to 10 mol %, based on the total number of moles in the copolymer.

The surface leveling agent may be used in a variety of different compositions. In an embodiment, the surface leveling agent may be used in a solvent or solvent mixture only, acting as a rinse formulation. In another embodiment, the surface leveling agent may be used in a composition that comprises a matrix polymer, a solvent, and other optional additives.

In an embodiment, the surface leveling agent may be used in a photoresist composition that contains a polymeric matrix resin, an optional quencher, one or more photoacid generators, optional additives and a solvent. The matrix polymer is preferably a copolymer that contains at least one or more repeating units that contain an acid-labile group and/or contains crosslinkable functionalities. If used, the surface leveling agent is present in an amount of from 0.001 to 100 wt %, more preferably 0.001 to 1 wt %, based on total solids of the composition.

In another embodiment, the surface leveling agent may be used in a photoresist composition that in addition to the surface leveling agent, contains a matrix polymer, a photoacid generator, an optional quencher, a solvent, and other optional additives.

In another embodiment, the surface leveling agent may be used in a composition that contains in addition to the surface leveling agent, a matrix polymer, at least one thermally activated acid generator, and a solvent. Other optional additives may be added to the composition, including but not limited to crosslinking agents. Examples of compositions that contain thermal activated acid generators can be antireflective coating compositions, top coat, photoresist trimming or pattern enhancement composition, and other underlayer compositions.

The polymer matrix that is used in the foregoing compositions may include a thermoplastic polymer, a blend of thermoplastic polymer, a thermosetting polymer, or a blend of a thermoplastic polymer with a thermosetting polymer. The polymer matrix may also include a blend of polymers, copolymers, terpolymers, or combinations comprising at least one of the foregoing polymers. The polymer matrix may also include an oligomer, a homopolymer, a copolymer, a block copolymer, an alternating copolymer, a random polymer, a random copolymer, a random block copolymer, a gradient copolymer, a graft copolymer, a star block copolymer, a dendrimer, a polyelectrolyte (polymers that have some repeat groups that contain electrolytes), a polyampholyte (a polyelectrolyte having both cationic and anionic repeat groups), an ionomer, or the like, or a combination thereof. The copolymer may be available as a dissolved molecule, in the form of a microparticle, or in the form of a nanoparticle dispersion or suspension in the solvent or solvent mixtures.

Examples of thermoplastic polymers include polyacetals, polydienes, polyacrylics, polycarbonates, polyalkyds, polystyrenes, polyolefins, polyesters, polyamides, polyaramides, polyamideimides, polyarylates, polyurethanes, epoxies, phenolics, silicones, polyarylsulfones, polyethersulfones, polyphenylene sulfides, polysulfones, polyimides, polyetherimides, polytetrafluoroethylenes, polyetherketones, polyether ether ketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polysiloxanes, or the like, or a combination thereof.

Examples of thermosetting polymers include epoxy polymers, unsaturated polyester polymers, polyimide polymers, bismaleimide polymers, bismaleimide triazine polymers, cyanate ester polymers, vinyl polymers, benzoxazine polymers, benzocyclobutene polymers, acrylics, alkyds, phenol-formaldehyde polymers, novolacs, resoles, melamine-formaldehyde polymers, urea-formaldehyde polymers, hydroxymethylfurans, isocyanates, diallyl phthalate, triallyl cyanurate, triallyl isocyanurate, unsaturated polyesterimides, or the like, or a combination thereof. The composition may comprise a crosslinking agent to facilitate the formation of the thermosetting polymer. The crosslinking agent may be self-crosslinking, an acid or base activated crosslinking agent, a free-radical crosslinking agent, or a combination thereof.

Suitable solvents include, for example: aliphatic hydrocarbons such as hexane and heptane; aromatic hydrocarbons such as toluene and xylene; halogenated hydrocarbons such as dichloromethane, 1,2-dichloroethane and 1-chlorohexane, alcohols such as methanol, ethanol, 1-propanol, iso-propanol, tert-butanol, 2-methyl-2-butanol and 4-methyl-2-pentanol, propylene glycol monomethyl ether (PGME), ethers such as diethyl ether, tetrahydrofuran, 1,4-dioxane and anisole; ketones such as acetone, methyl ethyl ketone, methyl iso-butyl ketone, 2-heptanone and cyclohexanone (CHO); esters such as ethyl acetate, n-butyl acetate, propylene glycol monomethyl ether acetate (PGMEA), ethyl lactate (EL), hydroxyisobutyrate methyl ester (HBM) and ethyl acetoacetate; lactones such as gamma-butyrolactone (GBL) and epsilon-caprolactone; lactams such as N-methyl pyrrolidone; nitriles such as acetonitrile and propionitrile; cyclic or non-cyclic carbonate esters such as propylene carbonate, dimethyl carbonate, ethylene carbonate, propylene carbonate, diphenyl carbonate, and propylene carbonate; polar aprotic solvents such as dimethyl sulfoxide and dimethyl formamide; water; and combinations thereof. Of these, preferred solvents are PGME, PGMEA, EL, GBL, HBM, CHO, and combinations thereof. The total solvent content (i.e., cumulative solvent content for all solvents) in the composition is typically from 40 to 99 wt %, for example, from 70 to 99 wt %, or from 85 to 99 wt %, based on total weight of the photoresist composition. The desired solvent content will depend, for example, on the desired thickness of the coated photoresist layer and coating conditions.

The composition is first manufactured by mixing together the matrix polymer, the surface leveling agent and any other solid components and optional additives, with solvent. The composition may be subjected to additional processes such as filtration, ion exchange, and the like, before being used. The composition can be applied to a substrate by spin-coating, dipping, roller-coating or other coating methods. The substrate may include electronic device substrates, metal, wood, paper, polymeric substrates or underlayers. The solids content of the coating solution may be varied to provide films of variable thicknesses. The solids content may also be based upon the specific coating equipment utilized, the viscosity of the solution, the speed of the coating tool and the amount of time used for the spinning. In an embodiment, the layer of the composition may be applied in a single application. In another embodiment, the layer of composition may be applied in multiple applications.

Depending on the particular coating composition, it may be beneficial to soft-bake the composition layer (disposed on the substrate) to minimize the solvent content in the film. The soft-bake facilitates the formation of a tack-free coating and improves adhesion of the composition layer to the substrate. The soft-bake can be conducted on a hotplate or in an oven, or alternatively may be conducted using ultraviolet light or using lasers.

In the case of the photoresist composition, the layer may then be exposed patternwise to permit irradiation through a photomask, via direct write or contact or via a pattern produced using light interference to create a difference in solubility between exposed and unexposed regions. This irradiation forms a latent image in the layer. The photomask has optically transparent and optically opaque regions that correspond to regions of the composition layer that are to be exposed or unexposed by the activating radiation.

The composition layer may optionally undergo a postexposure bake process after which it is developed to provide a resist relief image. In an embodiment, an alkaline developing solution is used to remove exposed portions of the composition layer. Examples of the alkaline developing solution include aqueous solutions of tetramethyl ammonium hydroxide, sodium hydroxide and potassium hydroxide. The exposed portions can form a pattern such as a hole (e.g., contact, via or bump pattern) or trench (e.g., line-space) pattern.

In one embodiment, the surface leveling agent is advantageous because it is miscible with water and aqueous developers. In another embodiment, the surface leveling agent displays an appropriate level of hydrophobicity and is not miscible with water and aqueous developers, which renders it miscible with an organic solvent developer. It does not contain fluorine and is therefore environmentally friendly.

The surface leveling agent may be used as a wetting agent for improving flow control. These properties (surface leveling and wetting capability) provide good optical properties (e.g., high gloss and good distinctness of image) to coatings. The surface leveling agent can therefore be blended with a wide variety of solutions, waxes, polishes, coatings, blends, and the like. In an embodiment, the surface leveling agent may be used in floor polish formulations, painting, powder coating compositions, or the like.

The invention will now be exemplified by the following non-limiting examples.

Example

Example 1

This prophetic example is conducted to demonstrate the synthesis of the monomeric repeat unit that is used in the copolymer (the surface leveling agent). The copolymer is manufactured using 3-butyloxymethyl-3-methyloxetane as one of the monomers and tetrahydrofuran and the other monomer. In other words, 3-butyloxymethyl-3-methyloxet-ane is used to manufacture the first polymeric unit of the copolymer and tetrahydrofuran is used to manufacture the second polymeric unit of the copolymer. The synthesis of the 3-butyloxymethyl-3-methyloxetane monomer is performed as follows.

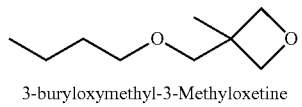

3-buryloxymethyl-3-Methyloxetine

A dispersion of 50 weight percent (2.8 grams, 58.3 mmol) sodium hydride in mineral oil, is washed twice with hexane and suspended in 35 milliliters of dimethyl formamide. 3.9 grams (52.6 mmol) of butanol is then added to the dispersion and the mixture stirred for 45 minutes, A solution of 10.0 grams (39 mmol) of 3-hydroxymethyl-3-methyloxetane p-toluenesulfonate in 15 milliliters of dimethyl formamide is added and the mixture is heated at 80° C. for 20 hours, when $^1$H-NMR analysis of an aliquot sample shows that the starting sulfonate is completely consumed.

The mixture is then poured into 100 milliliters of ice water and extracted with 2 volumes of methylene chloride. The combined organic extracts are washed twice with water, twice with 2 weight percent aqueous hydrochloric acid, brine, dried over magnesium sulfate, and evaporated to give 3-(2,2,2-trifluoroethoxymethyl)-3-methyloxetane as an oil containing less than 1 weight percent dimethyl formamide. The oil is distilled under reduced pressure to give analytically pure 3-butyloxymethyl-3-methyloxetane monomer.

The synthesis of the (3-methyloxetan-3-yl) methyl 3,3-dimethylbutanoate monomer is performed as follows.

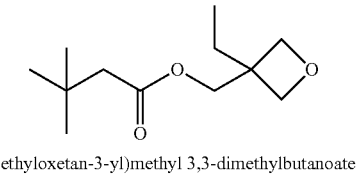

(3-ethyloxetan-3-yl)methyl 3,3-dimethylbutanoate

Into a 100 mL four-necked flask, 10.0 g of 3,3-dimethylbutanoic anhydride (46.7 mmol), 0.6 g of dimethylaminopyridine (4.7 mmol), are dissolved in 250 ml of dichloromethane. 6.0 g of 3-ethyl-3-hydroxymethyloxetane (51.4 mmol) is added slowly under ice water bath, and the reaction is left stirring at room temperature for 24 hours. The reaction mixture is then washed with saturated sodium bicarbonate aqueous solution, water and brine, and then dried over magnesium sulfate overnight. The solvent is removed and the oil is distilled under reduced pressure to give analytically pure (3-ethyloxetan-3-yl)methyl 3,3-dimethylbutanoate.

Example 2

This prophetic example is conducted to demonstrate the synthesis of the polymer that is used as the surface leveling agent. The method of preparing a copolymer using a functional oxetane and tetrahydrofuran is detailed below.

A 400 ml flask (fitted with a condenser, a thermocouple temperature probe and a mechanical stirrer) is charged with anhydrous methylene chloride (100 ml) and 1,4-butanediol (2.03 g, 22.6 mmoles). BF$_3$THF (29.6 g, 211.7 moles), 2,2-dimethyl-1,3-propanediol (22.1 g, 211.7 mmol) is then added, and the mixture is stirred for 10 minutes. A solution of 3-butyloxymethyl-3-methyloxetane (67 g. 423.4 moles) in anhydrous methylene chloride (30 ml) is then pumped into the vessel over 5 hours. The reaction temperature is maintained between 38 and 42° C. throughout the addition. The mixture is then refluxed for an additional 2 hours (while simultaneously being stirred), after which ¹H-NMR indicated ≤98% conversion. The reaction is quenched with 10% aqueous sodium bicarbonate (200 ml) and the organic phase is washed with 3% aq. HCl (200 ml) and with water (200 ml). The organic phase is dried over sodium sulfate, filtered, and stripped of solvent under reduced pressure to give of (3-methyloxetan-3-yl) methyl 3,3-dimethylbutanoate monomer as a clear oil.

Example 3

This prophetic example is conducted to determine the resist coating and development properties of the resist composition. The formulations R1-R4 (resist compositions) and CR1-CR2 (comparative resist compositions) are prepared with components and in amounts shown in Table 1. In Table 1, the number in the parenthesis indicates the weight ratio of each component. The structures represented by C1-2, D1-2, and S1-2 are depicted below the Table 2. It is to be noted that all of the polymers in Table 1 are prepared according to this general synthesis protocol.

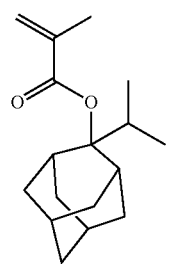

1

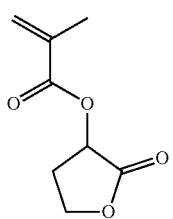

2

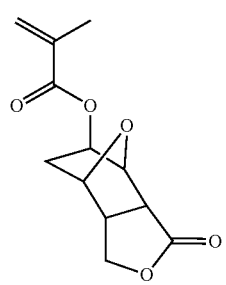

3

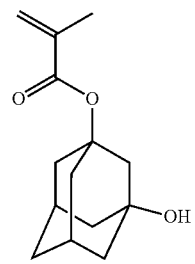

4

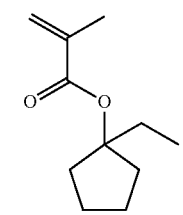

5

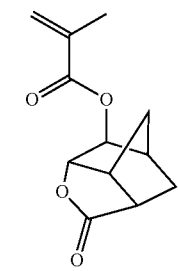

6

TABLE 1

(In this Table 1, all the numbers in the parenthesis represent the mole percent of the monomer in the copolymer). Monomer numbers (e.g., Monomer 1) relate to the structures shown immediately above.

| Matrix Resin Polymer | Monomer 1 | Monomer 2 | Monomer 3 | Monomer 4 |
|---|---|---|---|---|
| A1 | 1 (40%) | 2 (30%) | 3 (20%) | 4 (10%) |
| A2 | 5 (40%) | 2 (40%) | 6 (20%) | |

TABLE 2

| Resist Composition | Polymer 1 (grams) | Additive 1 (grams) | Additive 2 (grams) | Surface leveling agent (grams) | Solvent (grams) |
|---|---|---|---|---|---|
| R1 | A1 [3.78] | C1 [0.88] | D1 [0.18] | E1 [0.01] | S1/S2 [33.95/63.05] |
| R2 | A2 [3.78] | C1 [0.88] | D1 [0.18] | E1 [0.01] | S1/S2 [33.95/63.05] |
| CR1 | A1 [3.78] | C1 [0.88] | D2 [0.18] | E2 [0.01] | S1/S2 [33.95/63.05] |
| CR2 | A2 [3.78] | C2 [0.88] | D2 [0.18] | E2 [0.01] | S1/S2 [33.95/63.05] |

The structures for the additives (C1, C2, D1 and D2) and the solvents (S1 and S2) are shown immediately below.

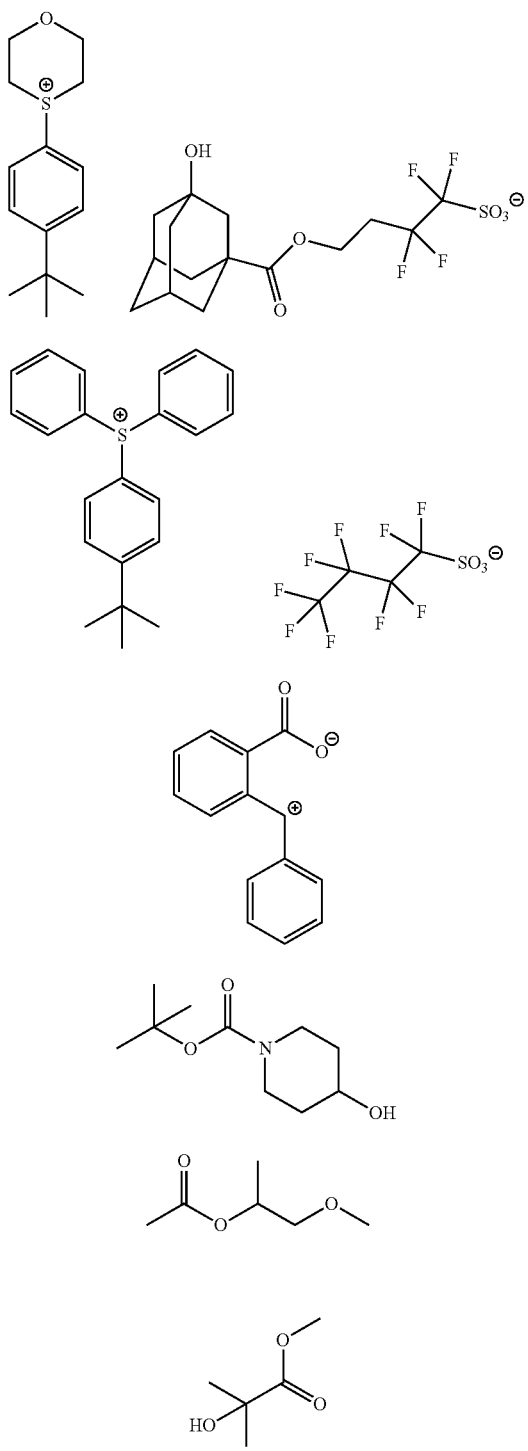

E2 is PolyFox PF-656, which is a commercial material from Omnova Solution Incorporation

PolyFox PF-656

$x + y \approx 6$

Each formulation is made with the components shown in Table 2 and mixed together overnight (via stirring), then passed through 0.2 micrometer filter, spun coat on a wafer and then exposed to patterns of 65 nm/130 nm pitch line/space under an ASML 1100 scanner at increasing focus with an increasing dose and then post exposed baked (PEB) at 100° C. for 60 seconds. Following PEB, the wafers are developed in 0.26 N aqueous TMAH developer for 12 seconds, rinsed with distilled water and spun dry.

Coating defect evaluation is performed on a spin-coated wafer of the compositions described above. After spin-coating the composition onto a hexamethyidisilazane (HDMS) primed silicon wafer, metrology is carried out on a Hitachi CG4000 CD-SEM and SP2 tool evaluation. Defect counts and haze value are measured for comparison.

To evaluate patterning defects, immersion lithography is carried out with a TEL Lithius 300 mm wafer track and ASML 1900i immersion scanner at 1.3 NA (numerical aperture), 0.86/0.61 inner/outer sigma, and dipole illumination with 35Y polarization. Wafers for photolithographic testing are coated with 800 Å AR40A bottom antireflective coating (BARC) using a cure of 205° C./60 seconds. Over the AR40A layer is coated 400 Å of AR104 BARC using a cure of 175° C./60 sec. Over the BARC stack is coated 900 Å of photoresist using a 90° C./60 second soft bake. Wafers are exposed to patterns of 55 nm/110 nm pitch line/space at increasing focus and increasing dose and then post exposure baked (PEB) at 100° C./60 seconds. Following PEB, wafers are developed in 0.26 N aqueous TMAH developer for 12 sec, rinsed with distilled water, and spun dry. Metrology is then carried out on a Hitachi CG4000 CD-SEM and defect numbers are counted for comparison.

It is expected that the surface leveling agent described in this invention can be advantageously used to produce photoresist compositions that do not contain a large number of coating and patterning defects.

What is claimed is:
1. A copolymer comprising:
first polymerized units of the formula (1):

(1)

wherein: $R_1$ is H or a substituted or unsubstituted $C_1$-$C_6$ alkyl group; and $R_2$ is a substituted or unsubstituted $C_3$-$C_{20}$ alkyl group that optionally includes one or more of —O—, —S—, —N—, —C(O)—, or —C(O)O—, —N—C(O)—, —C(O)—NR—; where R is H or a Polymer A1 and A2 have a weight average molecular weight of 8000 g/mole. E1 is the poly-3-(2,2,2-trifluoroethoxymethyl)-3-methyloxetane as described in the synthesis Example 2.

substituted or unsubstituted $C_1$-$C_6$ alkyl group; wherein $R_2$ has a branched structure; and second polymerized units of the formula (2):

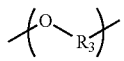
(2)

wherein: $R_3$ is a substituted or unsubstituted $C_1$-$C_6$ alkylene group that optionally includes one or more of —O—, —N—, —S—, —C(O)—, or —C(O)O—;

wherein the first polymerized units and the second polymerized units are chemically different, and the copolymer is free of fluorine; and wherein the first polymerized units of the formula (1) are present in the copolymer in an amount of greater than 60 mol %, based on the total number of moles in the copolymer.

2. The copolymer of claim 1, where the copolymer further comprises a third polymerized unit of formula (3);

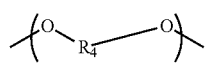
(3)

wherein $R_4$ is a C2 to C6 alkylene that may optionally be substituted with one or more of —O—, —S—, —N—, —C(O)—, or —C(O)O—, —N—C(O)—, or —C(O)—NR—; where R is H or a substituted or unsubstituted $C_1$-$C_6$ alkyl group.

3. The copolymer of claim 2, wherein the first polymerized units are of the formula (1-1), the second polymerized units are of the formula (2-1), and further comprising third polymerized units of the formula (4):

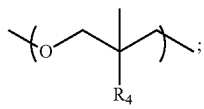
(1-1)

wherein: $R_4$ is a substituted or unsubstituted $C_3$-$C_{20}$ alkyl group that optionally includes one or more of —O—, —S—, —N—, —C(O)—, or —C(O)O—, wherein $R_4$ has a branched structure;

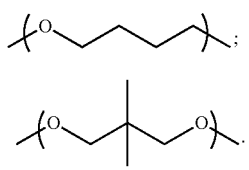
(2-1)
(4)

4. A composition comprising the copolymer of claim 1, and a solvent.

5. A coating method, comprising:
applying a layer of a composition of claim 4 on a substrate.

6. A pattern formation method, comprising:
applying a layer of a composition of claim 4 on a substrate;

exposing the composition layer to activating radiation; and developing the composition layer to provide a resist relief image.

7. A composition comprising: a copolymer comprising:
first polymerized units of the formula (1):

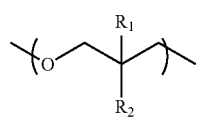
(1)

wherein: $R_1$ is H or a substituted or unsubstituted $C_1$-$C_6$ alkyl group; and $R_2$ is a substituted or unsubstituted $C_3$-$C_{20}$ alkyl group that optionally includes one or more of —O—, —S—, —N—, —C(O)—, or —C(O)O—, —N—C(O)—, —C(O)—NR—; where R is H or a substituted or unsubstituted $C_1$-$C_6$ alkyl group; and second polymerized units of the formula (2):

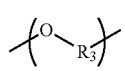
(2)

wherein: $R_3$ is a substituted or unsubstituted $C_1$-$C_6$ alkylene group that optionally includes one or more of —O—, —N—, —S—, —C(O)—, or —C(O)O—;

wherein the first polymerized units and the second polymerized units are chemically different, and the copolymer is free of fluorine; and wherein the first polymerized units of the formula (1) are present in the copolymer in an amount of greater than 60 mol %, based on the total number of moles in the copolymer;

a matrix polymer that comprises an acid-decomposable group; and a photoacid generator.

8. A composition comprising: a copolymer comprising:
first polymerized units of the formula (1):

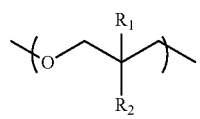
(1)

wherein: $R_1$ is H or a substituted or unsubstituted $C_1$-$C_6$ alkyl group; and $R_2$ is a substituted or unsubstituted $C_3$-$C_{20}$ alkyl group that optionally includes one or more of —O—, —S—, —N—, —C(O)—, or —C(O)O—, —N—C(O)—, —C(O)—NR—; where R is H or a substituted or unsubstituted $C_1$-$C_6$ alkyl group; and second polymerized units of the formula (2):

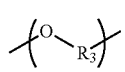
(2)

wherein: $R_3$ is a substituted or unsubstituted $C_1$-$C_6$ alkylene group that optionally includes one or more of —O—, —N—, —S—, —C(O)—, or —C(O)O—;
wherein the first polymerized units and the second polymerized units are chemically different, and the copolymer is free of fluorine; and wherein the first polymerized units of the formula (1) are present in the copolymer in an amount of greater than 60 mol %, based on the total number of moles in the copolymer;

a matrix polymer; and a thermal acid generator.

9. A composition comprising: a copolymer comprising:
first polymerized units of the formula (1):

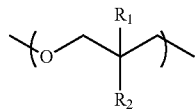

(1)

wherein: $R_1$ is H or a substituted or unsubstituted $C_1$-$C_6$ alkyl group; and $R_2$ is a substituted or unsubstituted $C_3$-$C_{20}$ alkyl group that optionally includes one or more of —O—, —S—, —N—, —C(O)—, or —C(O)O—, —N—C(O)—, —C(O)—NR—; where R is H or a substituted or unsubstituted $C_1$-$C_6$ alkyl group; and
second polymerized units of the formula (2):

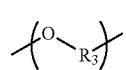

(2)

wherein: $R_3$ is a substituted or unsubstituted $C_1$-$C_6$ alkylene group that optionally includes one or more of —O—, —N—, —S—, —C(O)—, or —C(O)O—;
wherein the first polymerized units and the second polymerized units are chemically different, and the copolymer is free of fluorine; and wherein the first polymerized units of the formula (1) are present in the copolymer in an amount of greater than 60 mol %, based on the total number of moles in the copolymer;

a matrix polymer; and a crosslinking agent.

* * * * *